United States Patent [19]

Hunsinger

[11] 4,417,221
[45] Nov. 22, 1983

[54] SURFACE ACOUSTIC WAVE DEVICE HAVING IMPROVED MULTI-STRIP COUPLER

[75] Inventor: Bill J. Hunsinger, Mahomet, Ill.

[73] Assignee: Harris Corporation, Melbourne, Fla.

[21] Appl. No.: 364,924

[22] Filed: Apr. 2, 1982

[51] Int. Cl.³ .................... H03H 9/42; H03H 9/64; H03H 9/145

[52] U.S. Cl. .................... 333/194; 333/153; 333/195; 310/313 D

[58] Field of Search .................... 333/150–155, 333/193–196; 310/313 R, 313 A, 313 B, 313 C, 313 D; 29/25, 35

[56] References Cited

U.S. PATENT DOCUMENTS

| | | | |
|---|---|---|---|
| 3,947,783 | 3/1976 | Maerfeld | 333/153 |
| 4,166,987 | 9/1979 | Coldren | 333/109 |
| 4,357,584 | 11/1982 | Murray et al. | 333/195 |
| 4,369,390 | 1/1983 | Malocha et al. | 310/313 B |
| 4,370,633 | 1/1983 | Schofield | 333/195 |

Primary Examiner—Marvin L. Nussbaum
Attorney, Agent, or Firm—Yount & Tarolli

[57] ABSTRACT

A surface acoustic wave (SAW) device is disclosed. The SAW device includes input and output transducers disposed in spaced acoustic tracks on a piezoelectric substrate material, and a multi-strip coupler for translating the acoustic beam generated by the input transducer into the acoustic track in which the output transducer is located. The multi-strip coupler is designed so as to minimize the influence of Fresnel peaks found to exist in the amplitude profile of the acoustic beam in the output acoustic track. The multi-strip coupler is longer than in the past, and includes a central fanned region for providing well defined acoustic boundaries whose locations do not vary from device to device.

25 Claims, 7 Drawing Figures

SURFACE ACOUSTIC WAVE DEVICE HAVING IMPROVED MULTI-STRIP COUPLER

BACKGROUND AND FIELD OF THE INVENTION

The present invention relates to surface acoustic wave devices, and more particularly to surface acoustic wave devices employing two transducers which are acoustically coupled through use of a multi-strip coupler.

Surface acoustic wave (SAW) devices include a substrate of piezoelectric material, such as lithium niobate, upon which a metallized pattern is formed. One part of the pattern represents an input transducer and another part represents an output transducer. The input transducer transforms an applied electrical signal into an acoustic wave propagating along the surface of the substrate material. The output transducer is disposed in the path of the acoustic wave, and transforms it back into an electrical output signal, usually having somewhat different characteristics than the input signal.

Some conventional design surface acoustic wave devices include input and output transducers which are disposed in different acoustic tracks on the piezoelectric substrate. Acoustic energy is coupled between the two acoustic tracks by use of a third metallized pattern, known as a multi-strip coupler, which extends across both tracks. The multi-strip coupler is largely insensitive to the bulk acoustic waves which are incidentally generated by the input transducer. Because of this, bulk acoustic waves remain within the acoustic track of the input transducer and do not interfere with the operation of the output transducer.

The transfer characteristic of a surface acoustic wave device can be selected by careful design of the input and output transducers. The transfer characteristic of a surface acoustic wave device can, for example, be designed to be frequency selective, whereby the device acts as a filter. Surface acoustic wave devices are quite popular as filters, since they can be designed to exhibit sharp cut-off frequencies and flat pass band response characteristics. For this reason surface acoustic wave devices have found use, for example, in television transmitters and receivers.

An ideal bandpass filter would have a flat frequency response (amplitude and phase) across the pass band, and zero response to frequencies outside of the pass band. Performance of SAW filters approach that of an ideal filter in many respects. Nonetheless, there is some residual deviation from a flat transfer characteristic across the pass band of the filter. The ripple in the pass band transfer characteristic of the SAW filter is undesirable. When the SAW filter is used in a TV transmitter as a vestigial sideband (VSB) filter, for example, the residual frequency response ripple introduces some distortion into the video signal, thereby degrading the video image subsequently presented. It would be desirable to provide a SAW filter which exhibited reduced ripple in the frequency response characteristic of the filter across the pass band thereof.

SUMMARY OF THE INVENTION

It is one object of the present invention to provide an improved SAW filter.

It is another object of the present invention to provide a SAW device of the type including a multi-strip coupler, wherein the multi-strip coupler is modified so as to reduce ripples across the pass band in the frequency response of the device.

It is still another object of the present invention to provide a SAW device which can be manufactured such that device-to-device inconsistencies are reduced.

It is yet another object of the present invention to provide an improved vestigial sideband SAW filter for use in television broadcasting.

It has now been found that the acoustic wave provided in the second track by the multi-strip coupler has pronounced Fresnel peaks in its beam amplitude profile near the boundaries of the second track of the multi-strip coupler, and that these peaks contribute to the pass band ripple of the filter. It has moreover been found that the output transducer can be positioned in the second track such that the pronounced Fresnel peaks in the beam amplitude profile occur outside the active region of the output transducer, whereby their effect on the characteristics of the filter are reduced.

Also, the location of the peak in the beam amplitude profile at the inner boundary of the second track has been found to vary from device to device, since the acoustic absorber used in the past to define that boundary could not be precisely positioned. By defining the boundary by bends in the multi-strip coupler elements, rather than by an acoustic absorber, the peak can be located in a position which does not vary from device to device. Because the location of the peak is therefore uniform, its residual effect can be corrected by standard transducer design techniques.

In accordance with the teachings of the present invention, then, a surface acoustic wave device is provided including a substrate upon which acoustic waves can be transmitted and received, means for transmitting an acoustic wave along a first track on the surface, a multi-strip coupler for coupling the acoustic wave from the first track to a second track, and means disposed in the second track for receiving the acoustic wave provided therein by the multi-strip coupler. The receiving means is positioned in the second track such that it is nonresponsive to the peak in the beam amplitude profile of the surface acoustic wave generated in the second track by the multi-strip coupler.

In accordance with another aspect of the present invention the inner boundary of the second track is defined by bends in the individual filamentary conductors which together make up the multi-strip coupler, whereby the boundary is located in a position which does not vary from device to device.

BRIEF DESCRIPTION OF THE DRAWINGS

The foregoing and other objects and advantages of the present invention will become more readily apparent from the following detailed description, as taken in conjunction with the accompanying drawings, wherein.

FIG. is a block diagram of a television transmitter system in which the SAW device of the present invention can advantageously be employed.

DETAILED DESCRIPTION

Figure 1:
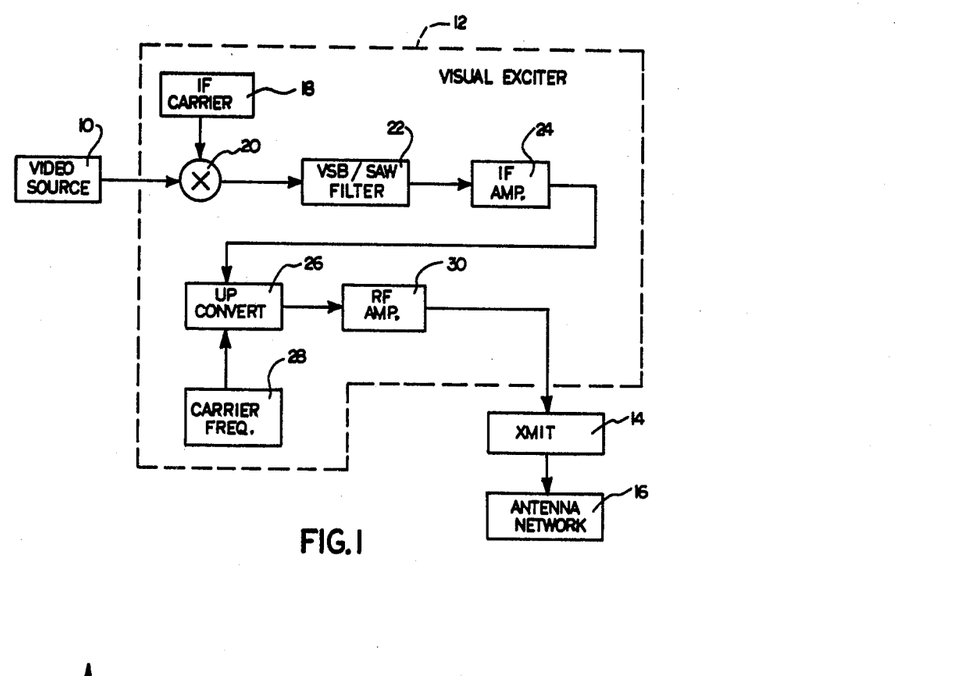

State-of-the art visual exciters in television transmitter systems use SAW filters to provide vestigial sideband (VSB) filtering of the video signal. FIG. 1 is a simplified block diagram of a transmitter system employing a SAW filter for this purpose. In FIG. 1 a video source 10 is shown as providing a video signal to a visual exciter 12 which amplitude modulates an RF carrier signal in accordance therewith. Normally an amplitude modulated signal is a double-sideband signal, including a carrier component and symmetrical upper and lower sidebands. Each sideband extends over a frequency range corresponding to the highest frequency in the modulating signal. Thus, if the modulating signal has a frequency range which extends up to 4.5 MHz, as does the video signal provided by the video source 10, then the upper and lower sidebands will extend over a total frequency range of 9 MHz. In order to conserve the television frequency spectrum, the Federal Communications Commission (FCC) of the U.S. government has mandated that the frequency range of this signal be reduced by eliminating a portion of the lower sideband. The resulting signal is referred to as a vestigial sideband (VSB) signal.

A low level RF vestigial sideband signal is generated by the visual exciter 12, and is applied to a transmitter 14. The transmitter 14 is conventionally a linear, high power RF amplifier. The resulting high level video signal is then directed to an antenna network 16 for transmission. An audio signal is modulated onto a separate RF carrier signal by a different transmitter, and is added into the output of the transmitter 14 by a diplexer connected between the transmitter 14 and the antenna network 16. For simplicity of illustration, the diplexer and other audio-channel elements are not shown in FIG. 1.

The visual exciter 12 performs most of the processing of the video signal at a standardized IF frequency of 37 MHz, thereby obviating the need for utilizing circuitry having frequency characteristics which are different for each different TV station carrier frequency. The visual exciter includes an IF carrier source 18 which provides a 37 MHz carrier signal at its output, and an amplitude modulator 20 which amplitude modulates this IF carrier signal with the video signal provided by video source 12. The output of the amplitude modulator 20 is a double sideband, amplitude modulated signal. This signal is provided to vestigial sideband (VSB) filter 22 which eliminates the majority of the upper sideband thereof so as to provide a vestigial sideband IF signal. In most state-of-the-art visual exciters the VSB filter is a SAW device. The VSB IF signal is then provided to an IF amplifier and processor circuit 24 which amplifies it, and which also provides various phase and amplitude adjustments of it.

The IF signal provided at the output of the IF amplifier 24 is directed to an UP converter 26 which mixes the VSB IF signal with a second carrier frequency. The second carrier is provided by a carrier source 28, and has a frequency equal to the station frequency plus 37 MHz. The result of the mixing is a composite signal including four frequency components: a carrier frequency component, an IF frequency component, a sum frequency component corresponding to the sum of the IF and carrier frequencies, and a difference frequency component corresponding to the difference between the IF and carrier frequency components. The UP converter 26 includes a harmonic filter to eliminate all of the four components except the one having frequencies corresponding to the difference between the frequencies of the IF signal and the carrier frequency. The remaining component is the component which is eventually transmitted by the TV station.

The UP conversion process essentially shifts the IF signal up in frequency to the station frequency, and "flips it over" so that the positions of the upper and lower sidebands are exchanged. Because the frequency band of the IF signal is "flipped over", the signal at the output of up converter 26 has a vestigial lower side band rather than a vestigial upper side band. The vestigial sideband signal at the output of the UP converter 26 is applied to the input of an RF amplifier 30, where it is further amplified. The amplified RF signal is then directed to the transmitter 14.

Figure 2:
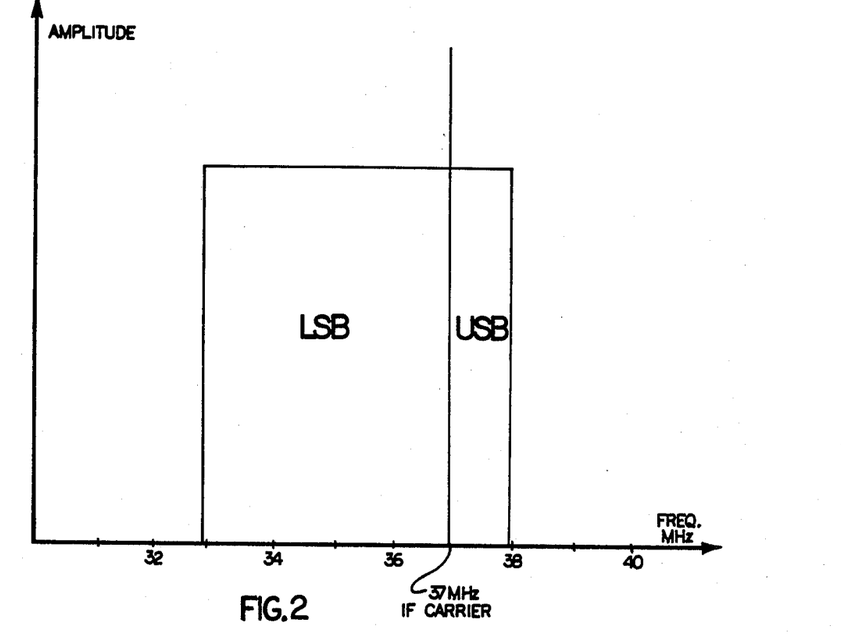
FIG. 2 is a graph of the ideal amplitude transfer characteristic of a vestigial sideband filter for use in the system of FIG. 1.
Figure 3:
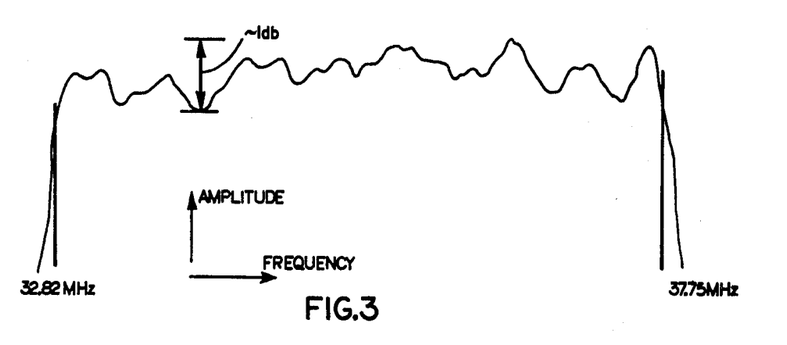
FIG. 3 is a graph of the pass band characteristic of a prior art vestigial sideband/SAW filter.

The VSB filter 22 ideally has an amplitude versus frequency characteristic such as shown in FIG. 2. Thus, ideally the amplitude response of the filter is flat over the entire pass band of the VSB filter, and tails off at an infinite slope at the corner frequencies thereof. In practice, of course, the VSB filter generally has a less than ideal transfer characteristic. FIG. 3 is an illustration of the amplitude versus frequency characteristic of a conventional VSB/SAW filter. In this Figure, as in FIG. 2, the frequency of the applied signal is represented on the horizontal axis and the amplitude response to the filter at each frequency is represented on the vertical axis. As illustrated in FIG. 3, prior art VSB/SAW filters having a generally flat characteristic across the pass band, but do nonetheless include some amplitude ripple also. The amplitude of the ripple may, for example, be on the order of one decibel peak to peak, and will vary from device to device.

The one decibel amplitude ripple across the pass band of the VSB/SAW filter introduces distortion in the video signal being broadcast by the TV station. This distortion manifests itself as degradation of the subsequently displayed picture. It is therefore desirable that the amplitude ripple be reduced as far as possible.

In accordance with the present invention, a SAW filter is provided which can be used as a VSB filter in a TV transmitter such as shown in FIG. 1, and which exhibits reduced amplitude ripple across the pass band of the filter.

Figure 4:
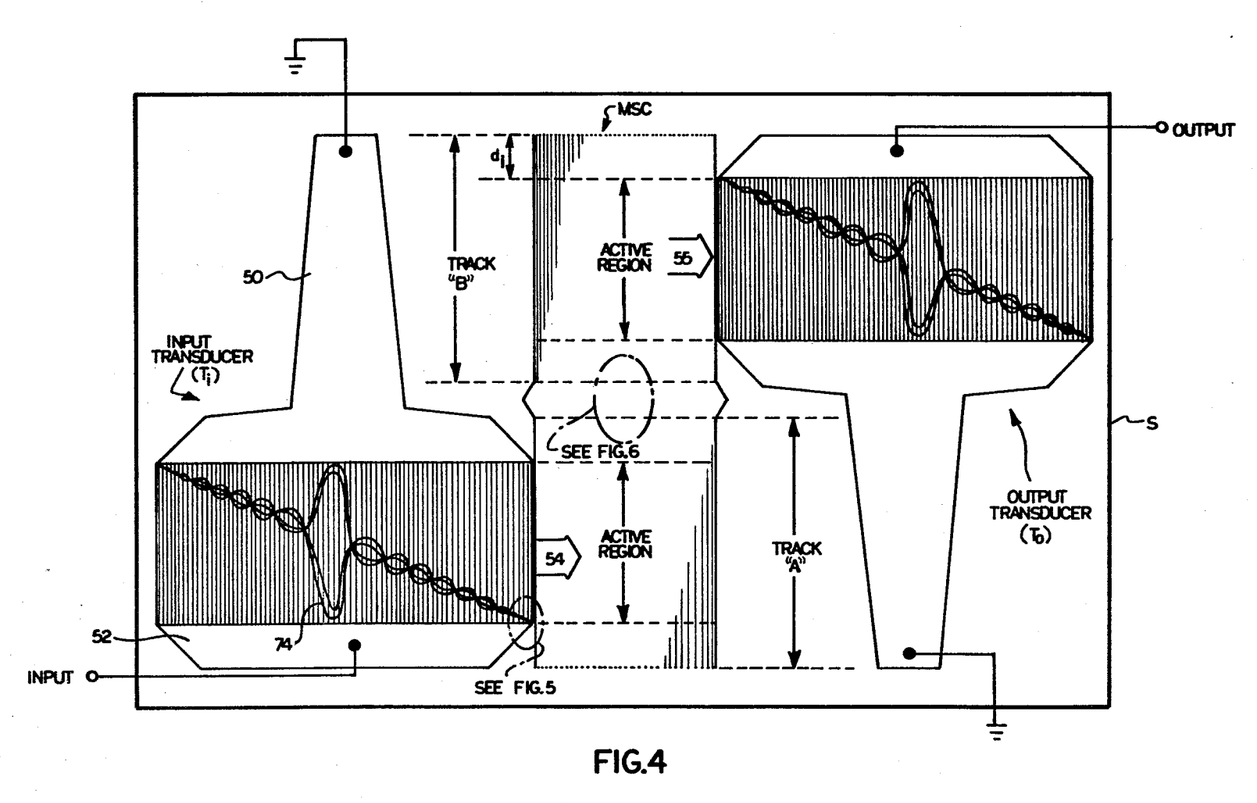
FIG. 4 is a plan view of a SAW filter in accordance with the teachings of the present invention.

FIG. 4 is an expanded scale plan view of one embodiment of a SAW filter in accordance with the teachings of the present invention. The actual device is much smaller, of course, being approximately the size of a postage stamp. The SAW filter includes a substrate material S of lithium niobate or similar material upon which a metallized pattern is formed by conventional techniques. The substrate material is piezoelectric: if an electric potential is applied across two closely spaced electrodes formed on the surface of the device, the substrate will be stressed or deformed at that point. If the electric potential varies, the stress will similarly vary, causing ripples (acoustic waves) to form on the substrate surface much as ripples form on the surface of a body of water when a stone is cast in. Similarly, when a surface acoustic wave passes under a pair of electrodes, a corresponding electric potential forms across the electrodes.

The metallized pattern formed on substrate S includes three components: an input transducer $T_i$, an output transducer $T_o$, and a multi-strip coupler MSC. Generally, the input transducer $T_i$ functions to transform an applied electrical signal into an acoustic wave propagating along track A of the substrate S. The multi-strip coupler MSC extends through track A, and translates the acoustic wave from track A to track B. The output transducer $T_o$ is located in track B and reconverts this acoustic wave back into an electrical signal, where the electrical signal represents the output of the filter. The input and output transducers can be designed so that the relationship between the input and output signal has a desired filter characteristic.

The input signal is supplied across two bus bars 50 and 52 of the input transducer. The two bus bars 50 and 52 have facing boundaries from each of which depends a number of conductive fingers. The fingers depending from the grounded bus bar 50 are parallel both to one another and to the fingers depending from the "hot" bus bar 52. The two sets of fingers are interdigitated in such a fashion that the input signal applied thereacross induces an acoustic wave which propagates in a direction generally perpendicular to the orientation of the fingers. Thus, the input transducer effectively transforms an electrical signal applied across the bus bars 50 and 52 into an acoustic wave propagating in a direction 54 towards and through the multi-strip coupler MSC. The active region of the transducer, wherein this transformation takes place, is generally bounded by the facing boundaries of the two bus bars 50 and 52.

The manner in which the fingers depending from the bus bar 50 interleave with the fingers depending from bus bar 52 cannot be readily portrayed in FIG. 4, in view of the very large number of fingers included in the transducer. There will, for example, often be several hundred of these fingers extending from each of the bus bars of the input transducer. The detailed configuration of the fingers can perhaps be more readily seen in FIG. 5, which is a detailed view of the portion of the input transducer $T_i$ adjacent a corner of the bus bar 52.

Figure 5:
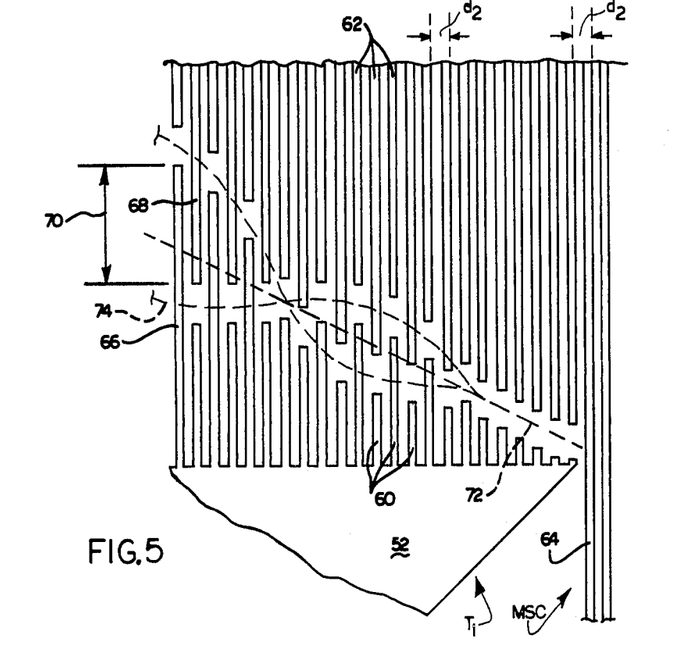
FIG. 5 is a detail view of a portion of the SAW filter of FIG. 4.

FIG. 5 shows a portion of the hot bus bar 52, plural linear and substantially parallel fingers 60 extending from a boundary of the bus bar 52, similar fingers 62 extending in the opposite direction from the ground bus bar 50, and several of the fingers 64 of the multi-strip coupler. (The multi-strip coupler will be described hereinafter.) The fingers 60 extending from the hot bus bar 52 are each essentially co-linear with a corresponding one of the fingers 62 extending from the grounded bus bar 50. The end of each of the fingers 60 terminates sufficiently distant from the termination of the corresponding one of the fingers 62 that the voltage drop thereacross does not induce a substantial acoustic wave. The pattern formed by the gaps between fingers 60 and 62 is symmetrical with respect to an axis 72 which extends transversely between one corner of the bus bar 52 and the diagonally opposing corner of the bus bar 50. These gaps are offset from the axis 72 over much of the length of the axis, whereby the fingers 60 overlap the fingers 62 to varying extents.

For example, the finger 66 extending from bus bar 52 overlaps the finger 68 extending from bus bar 50 in the region designated in FIG. 5 by reference numeral 70. An AC signal applied across the bus bar induces a corresponding acoustic wave in the region 70. This acoustic wave travels in a direction substantially perpendicular to the overlap, as indicated by the arrow 54 in FIG. 4. The individual acoustic waves generated by the various overlaps across the axis 72 add together to produce the acoustic wave which enters the multi-strip coupler. By controlling the overlap of the fingers along the axis 72, the relationship between the applied electrical signal and the resulting acoustic wave can be controlled.

For a bandpass filter, the pattern formed by the gaps between the fingers 60 and 62, also known as the "apodization" pattern, has a generally sin X/X distribution, reflected across axis 72 so that the resulting pattern (indicated at 74 in FIG. 4) is the same above and below axis 72. This pattern has a pronounced peak near the center of the transducer, and has progressively smaller peaks at points on the axis 72 nearer the ends of the transducers. The overlap pattern ends before reaching the ends of the axis 72, whereby the last several fingers are essentially nonoverlapped. These final few fingers, although not contributing to the acoustic wave response of the transducer, do provide a relatively smooth and reflection-free acoustic transition between the transducer and the multi-strip coupler.

The spacing between the multi-strip coupler and the two transducers is shown in FIGS. 4 and 5 as being equal to the spacing between the individual conductors and the multi-strip coupler, which is in turn equal to the spacing between the fingers in the active region of the input and output transducers. Because of this, there is no change in the acoustic impedance at the boundary between the multi-strip coupler and the transducers, whereby reduced reflections occur at this point. Alternatively, the multi-strip coupler could be spaced apart from the input transducer $T_i$ by a distance which is approximately one-half a wavelength different than the spacing of the output transducer $T_o$ from the multi-strip coupler. It has been found that this produces a cancellation effect which reduces the spurious reflection component otherwise created by passage of the acoustic wave into and out of the multi-strip coupler.

The purpose of the multi-strip coupler is merely to translate the surface acoustic wave from track A to track B, where track B is parallel to track A but transversely offset therefrom. The multi-strip coupler consists of a large number of filamentary conductors, each extending through both track A and track B. The various filamentary conductors are generally straight, although having a bent region between the two tracks, and are substantially parallel to one another except in the bent region.

As the acoustic wave generated by the input transducer $T_i$ passes the various filamentary conductors in track A of the multi-strip coupler, electrical potentials are developed across the individual filaments 64 of the multi-strip coupler. The electric potentials in turn induce a corresponding acoustic wave in track B. The acoustic wave travels in the direction indicated by the arrow 55, and thus enters the active region of the output transducer $T_o$. The output transducer is essentially identical to the input transducer, and thus likewise includes a plurality of fingers depending from the two bus bars thereof. The acoustic wave travelling along the active region of track B induces an electrical potential across the overlapping fingers in this region, where these incremental electrical potentials combine to produce the output signal which is taken from the hot bus bar of the device.

In the FIG. 4 SAW filter, the multi-strip coupler (MSC) has a form which is improved over the MSC's normally used in SAW devices of this kind. The MSC of FIG. 4 is, for example, long enough that its track A and track B portions are each substantially longer than the active regions of the corresponding transducers. In prior art SAW filters the MSC's extended only between the outside limits of the active regions of the two transducers. Also, the FIG. 4 MSC includes a bent region between the track A and B regions thereof which was not found in prior SAW filters of this kind.

Figure 7:
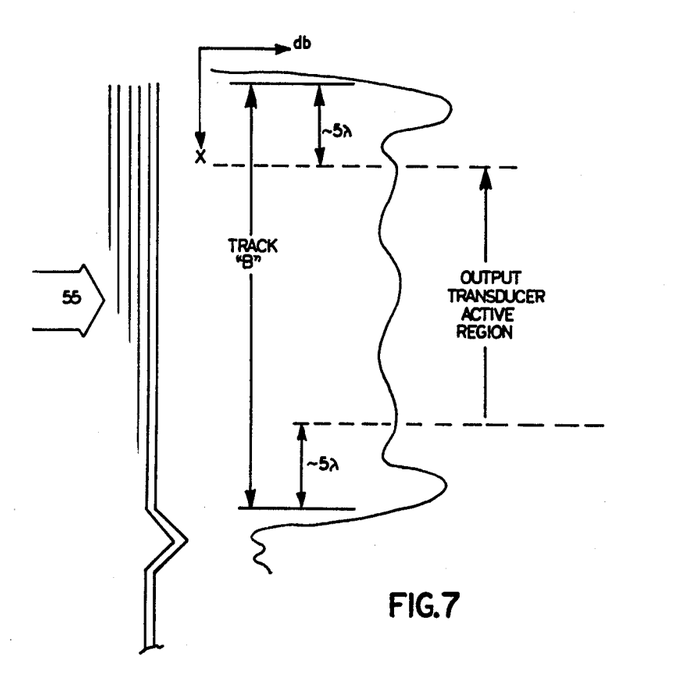
FIG. 7 is a graph of the beam amplitude profile of the acoustic wave provided in the second track of the SAW device of FIG. 4 by the multi-strip coupler.

The reason for these changes is related to the amplitude profile of the acoustic beam generated in track B by the MSC, and the effect it has on performance of the filter. It has now been found that the amplitude profile of the acoustic beam contains Fresnel ripples, and that these ripples are quite pronounced at the boundaries of the track. This is shown in FIG. 7, which is a graph representing the amplitude profile of the acoustic beam generated in track B of the multi-strip coupler. The peaks in the beam amplitude profile are frequency dependent, whereby the peaks (particularly those at the track boundaries) have different amplitudes at different frequencies.

The Fresnel ripples appear to be a significant factor contributing to the ripples in the amplitude versus frequency characteristic of the device. This is partly because in prior SAW filters the peaks at the boundaries of the beam amplitude profile impinged on the smaller overlap portions of the apodization, since prior MSC's had track A and B portions which were essentially no longer than the active regions of the input and output transducers. The smaller overlap portions of the apodization pattern are more sensitive to peaks in the beam amplitude profile since they "see" only a small portion of the profile. Larger overlap portions average the beam amplitude profile over a greater portion of the track, thereby being less sensitive to peaks in the profile.

The peaks in the beam amplitude profile of the acoustic wave generated by the multi-strip coupler extend over a distance corresponding to approximately five wavelengths of the propagating acoustic wave. In accordance with the present invention, the output transducer $T_o$ is transversely located in track B such that its active region is offset by five wavelengths from both of the track B boundaries of the multi-strip coupler. (The input transducer $T_i$ should be similarly positioned with respect to the track A portion of the multi-strip coupler). The output transducer is therefore physically displaced from the two most pronounced peaks, whereby their influence on the pass band characteristics of the filter is reduced. They do nonetheless produce some residual effect, however, since the Fresnel ripples, including the two largest peaks, tend to converge toward the center of the beam as it propagates towards and through the output transducer.

If the location of the peaks were uniform from device to device the effects thereof could be mitigated to some extent by readjusting the apodization pattern of the input and output transducers to produce a compensating predistortion of the characteristics of the two transducers. Predistortions of this type have been used in the past, however the nature of the problem being corrected was not known. Furthermore, portion attempts at use of compensating predistortion were not completely successful since the location of the Fresnel peak near the inner boundary of track B varied from device to device.

In the multi-strip coupler of FIG. 4 the location of that Fresnel peak is fixed by a bent or "fanned" region between track A and track B thereof. Multi-strip couplers in prior art SAW devices of this type did not included a fanned center section. Instead, the linear filaments of the track A region continued linearly through the intermediate portion and into the track B regions, whereby each filament was linear across the entire multi-strip coupler. In such prior art multi-strip couplers, acoustic boundaries between track A and track B were established by depositing a glue or other acoustic absorber material across the portion of the multi-strip coupler which was intermediate the track A and track B portions thereof. The purpose of this acoustic boundary was to prevent the acoustic beam generated by the input transducer $T_i$ from interfering with the acoustic beam generated by the track B portion of the multi-strip coupler.

Although the acoustic absorber material did provide an effective acoustic boundary between the two tracks, it was difficult in practice to precisely align the acoustic absorber material on the multi-strip coupler in a repeatable fashion. Consequently, the location of the acoustic absorber varied somewhat from device to device. The position of the Fresnel peak near the inner boundary of track B also varied with the position of the acoustic absorber.

The multi-strip coupler of FIG. 4 employs a different technique for establishing an acoustic boundary for the track A and track B portions of the multi-strip coupler. The technique involves fanning of the filaments of the multi-strip coupler at a point intermediate the two acoustical tracks. The fanning of the filaments of the multi-strip coupler is such that the fanned section neither absorbs or radiates acoustic energy. Consequently, the boundary of the radiating portion of the multi-strip coupler in track B is defined, not by an acoustic absorber deposited on the device, but rather by the location of the fanned central portion of the multi-strip coupler, itself.

This fanned center section is formed as part of the process which forms the multi-strip coupler. It can therefore be positioned quite precisely, and does not suffer from the same inconsistent positioning problems which had occurred with prior art techniques. The use of a fanned central section therefore improves the device to device consistency of the SAW filters, permitting residual effects of the Fresnel ripples to be corrected by standard apodization predistortion techniques. In the device of FIG. 4, an acoustic absorber material will again be deposited between the track A and track B portions of the multi-strip coupler, and this acoustic absorbing material will be aligned over the centeral portion of the fanned section of the multi-strip coupler. The boundary of the radiating portion of the multi-strip coupler in track B, however, is defined by the boundary of the fanned central section, rather than by the location of the acoustic absorbing material.

Figure 6:
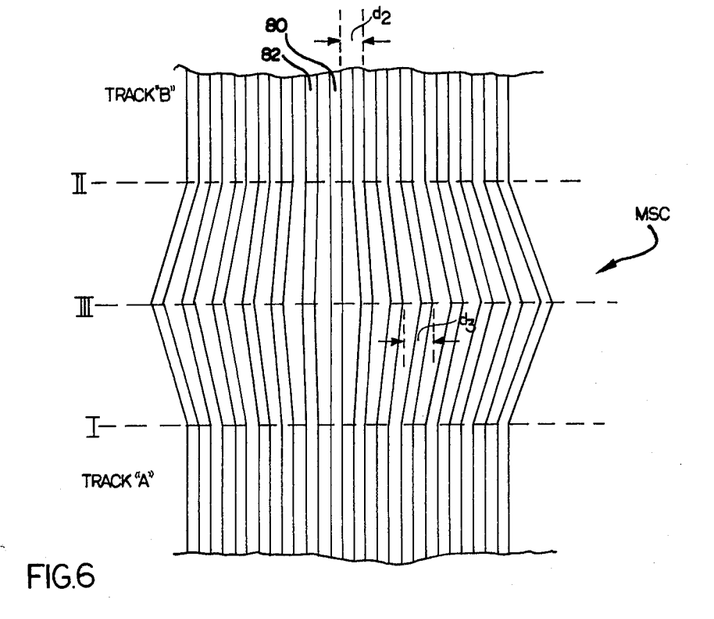
FIG. 6 is a detail view of another portion of the SAW filter of FIG. 4.

The configuration of the fanned central section of the surface acoustic wave device can perhaps more readily be seen in FIG. 6. FIG. 6 is a much expanded plan view of the central portion of the multi-strip coupler MSC. In FIG. 6, the centrally disposed filamentary conductor is indicated at 80. This filamentary conductor is the only conductor of the multi-strip coupler which follows a continuous linear (unbent) path through the central region between the two tracks of the acoustic surface wave device. The remaining filamentary electrodes follow a somewhat angular path through this central portion, delineated in FIG. 6 by the two boundaries I and II.

The portion of the multi-strip coupler below boundary I corresponds to track A, whereas the portion above boundary II corresponds to track B. In each of these two regions the filamentary conductors which make up the multi-strip coupler are parallel and are spaced apart by equal distances $d_2$. As the filamentary conductors pass through boundary I, however, they diverge slightly from one another so that the distance between the conductors increases. Upon arriving at boundary III, which occurs midway between boundaries I and II, the filamentary conductors are still spaced apart by equal amounts, however this amount is now $d_3$, which is somewhat greater than $d_2$. Preferably, $d_3$ is greater than 1.02 times $d_2$. After passing through boundary III, the filamentary conductors which make up the multi-strip coupler change their direction again, thereafter converging slightly. Upon arriving at boundary II, the spacing between the filamentary conductors of the multi-strip coupler is back to the same $d_2$ spacing as in the portion below boundary I.

As the acoustic wave travels through boundary I, it induces a voltage in each of the filamentary conductors of the multi-strip conductors. Since these conductors are not parallel, however, the signals induced therein do not add constructively, rather cancelling over the fanned central region of the MSC. The net result is that this portion of the multi-strip coupler is virtually nonresponsive to the acoustic wave provided in track A by the input transducer $T_i$. Similarly, the portions of the filamentary conductors between boundaries I and II do not radiate acoustic waves. This effect can be seen in the beam amplitude profile graph shown in FIG. 7.

Several other features of the SAW device of FIG. 4 should be noted. It should be noted, for example, that all edges of the bus bars of the input and output transducers are oblique relative to the direction of propagation of the acoustic waves in track A and track B. The purpose of this is to divert any reflections which may occur from these edges so that the extent to which they interfere with the acoustic beams in tracks A and B is reduced. This modification of the bus bar also reduces the capacitance between the hot bus bar 52 of the input transducer and the multi-strip coupler. Referring again to FIG. 5, it can be seen that the bus bar 52 is adjacent the multi-strip coupler MSC in only a very small area. The transducer fingers immediately adjacent the multi-strip coupler are grounded fingers, rather than hot fingers, whereby the capacitance effect is reduced here also.

Also, the substrate material S should be relatively thick so that bulk reflections off the opposite side of the substrate are attenuated and do not materially affect the operation of the transducers and multi-strip coupler.

Acoustic absorbing material will be used at positions to the left of the input transducer $T_i$ and to the right of the output transducer $T_o$ so as to absorb acoustical waves reaching these points on the substrate and thereby reduce reflected components. For simplicity of illustration, the acoustic absorbing material is not shown in the Figure.

Although the invention has been described with respect to a preferred embodiment, it will be appreciated that various rearrangements and alterations of parts may be made without departing from the spirit and scope of the present invention, as defined in the appended claims.

What is claimed is:

1. A surface acoustic wave device including a substrate upon which acoustic waves can be transmitted and received, means for transmitting an acoustic wave along a first track on said surface, a multi-strip coupler for coupling the acoustic wave from said first track to a second track, said acoustic wave in said second track having an amplitude profile transversely across said second track which exhibits a peak near at least one longitudinally extending boundary of said second track, and receiving means disposed in said second track for receiving said acoustic wave in said second track, said receiving means being responsive to essentially only those acoustic waves which pass through a sensitive region of said receiving means, said region having a first dimension transverse to said second track, where said first dimension is shorter than the width of the acoustic wave beam provided in said second track by said multi-strip coupler and where said receiving means is transversely positioned in said track so that said sensitive region is transversely spaced from said peak in said acoustic wave amplitude profile, whereby said receiving means is substantially nonresponsive to said at least one peak in the amplitude profile of said acoustic wave.

2. A surface acoustic wave device as set forth in claim 1, wherein said receiving means comprises first and second spaced bus bars, each having plural electrode fingers extending therefrom towards the other said bus bar in a direction generally transverse to said second track, where the fingers of the two bus bars are interdigitated such that said sensitive region represents the region over which said fingers are interdigitated.

3. A surface acoustic wave device as set forth in claim 2, wherein said sensitive region of said receiving means is transversely spaced from said boundary of said second track by a distance corresponding to more than five wavelengths of said acoustic wave.

4. A surface acoustic wave device as set forth in claim 2, wherein said multi-strip coupler includes boundary means between said first track and said second track, said boundary means defining said at least one longitudinally extending boundary of said second track.

5. A surface acoustic wave device as set forth in claim 4 wherein said acoustic beam in said second track is wider than said sensitive region of said receiving means by an amount corresponding to at least ten times the wavelength of said acoustic wave, and wherein said receiving means is located between the longitudinally extending boundaries of said second track such that said sensitive region is transversely spaced from each of said longitudinally extending boundaries by at least five times said wavelength.

6. A surface acoustic wave device as set forth in claim 5, wherein said multi-strip coupler includes boundary means between said first and second tracks, said boundary means defining one longitudinally extending boundary of said second track, and wherein the other longitudinally extending boundary of said second track is defined by a corresponding boundary of said multi-strip coupler.

7. A surface acoustic wave device as set forth in claim 6, wherein said multi-strip coupler comprises plural spaced filamentary conductors extending transversely across said first and second tracks, and wherein said boundary means comprises the portions of said filamentary conductors between said first and second tracks.

8. A surface acoustic wave device as set forth in claim 7, wherein said portions of said filamentary conductors representing said boundary means are not parallel to one another.

9. A surface acoustic wave device as set forth in claim 8, wherein said filamentary conductors diverge from one another over part of the distance between said first and second tracks and converge towards one another over another part of the distance between said first and second tracks.

10. A surface acoustic wave device as set forth in claim 2, wherein said multi-strip coupler is comprised of plural filamentary conductors, each including a first track portion, a second track portion, and a connecting portion electrically connecting said first and second track portions, where said first track portions of said conductors are substantially parallel to one another, said second track portions of said conductors are substantially parallel to one another, and said connecting portions are not parallel to one another.

11. A surface acoustic wave device as set forth in claim 10, wherein said connecting portions diverge from one another over part of the distance separating said first and second tracks and converge toward one another over another part of said distance.

12. A surface acoustic wave device as set forth in claim 10, wherein said filamentary conductors are bent at the points at which said connecting portions meet said second track portions, said bends defining one longitudinally extending boundary of said second track.

13. A surface acoustic wave device as set forth in claim 12 wherein said first and second tracks are transversely spaced from one another and further wherein said multi-strip coupler is comprised of plural filamentary conductors which are substantially parallel to one another in said first and second tracks and are not parallel to one another in a connecting region between said first and second tracks.

14. A surface acoustic wave device including a substrate having a surface upon which surface acoustic waves can be transmitted and received, a first transducer formed on said surface and excitable to produce an acoustic wave traveling along a first track on said surface, a second transducer formed on said surface for receiving acoustical waves traveling on a second track on said surface, and a multi-strip coupler formed on said surface for coupling acoustical waves from said first track to said second track, said multi-strip coupler including a plurality of spaced electrically conductive filaments each open circuited at both ends and extending through said first and second tracks, wherein said electrically conductive filaments are long enough that said open circuited ends lie substantially beyond the transverse boundary of the acoustic wave receptive area of the associated transducer.

15. A surface acoustic wave device as set forth in claim 14 wherein said open circuited ends each lie transversely beyond the boundary of the acoustic wave receptive area of the associated transducer by a distance corresponding to at least five wavelengths of said acoustic wave.

16. A surface acoustic wave device as set forth in claim 14, wherein said receiving means comprises first and second spaced bus bars, each having plural electrode fingers extending therefrom towards the other said bus bar in a direction generally transverse to said second track, where the fingers of the two bus bars are interdigitated such that said sensitive region represents the region over which said fingers are interdigitated.

17. A SAW filter comprising
a substrate having a surface upon which acoustic waves can be transmitted and received;
a first transducer formed on said surface and excitable to produce an acoustic wave traveling along a first track on said surface;
a second transducer formed on said surface for receiving acoustic waves traveling along a second track on said surface, substantially parallel to but spaced apart from said first track; and,
a multi-strip coupler for coupling acoustic energy from said first track to said second track, said multi-strip coupler including a first portion extending through said first track, a second portion extending through said second track, and a central connecting portion joining said first and second portions, wherein at least one of said first and second portions is long enough that it extends at least five wavelengths beyond the acoustically active region of the associated transducers in a direction transverse to the associated said track.

18. A surface acoustic wave device as set forth in claim 17, wherein said multi-strip coupler includes plural spaced electrically conductive filaments which are substantially parallel to one another in said first and second acoustic tracks and are not parallel to one another in the area between said first and second acoustic tracks.

19. A surface acoustic wave device as set forth in claim 12, wherein each of said first and second acoustic tracks has a transverse dimension which is greater than the corresponding dimension of the acoustically active region of the associated transducer by at least ten times the wavelength of said acoustic wave, and wherein each said transducer is formed in its corresponding track such that the associated acoustically active region is transversely spaced from each longitudinal boundary of said track by at least five times the wavelength of said acoustic wave.

20. A SAW filter comprising
a substrate having a surface upon which acoustic waves can be transmitted and received;
a first transducer formed on said surface and excitable to produce an acoustic wave traveling along a first track on said surface;
a second transducer formed on said surface for receiving acoustic waves traveling along a second track on said surface, substantially parallel to but spaced apart from said first track; and,
a multi-strip coupler for coupling acoustic energy from said first track to said second track, said multistrip coupler being formed of plural spaced electrically conductive filaments, wherein said filaments are parallel to one another and are spaced apart by a first distance across substantially the entire transverse dimension of each of said first and second tracks, and further wherein said filaments are not parallel to one another in a region between said tracks.

21. A SAW filter as set forth in claim 20, wherein said multi-strip coupler includes a first portion defining said first track, a second portion defining said second track, and a connecting portion joining said first and second portions, and further wherein said filaments diverge from one another over part of said connecting portion and converge toward one another over another part of said connecting portion.

22. A SAW filter as set forth in claim 20, wherein each of said filament has bends therein at the boundaries between the parallel and nonparallel portions thereof, said bends of said filaments defining longitudinal boundaries of the associated tracks.

23. A SAW filter as set forth in claim 22, wherein said track boundaries defined by said bends are each transversely spaced from the acoustically active region of the transducer in the associated track by at least five times the wavelength of said acoustic wave.

24. A SAW filter as set forth in claim 13 wherein each said acoustically active region of said transducer is also transversely spaced from the other longitudinal boundary of the associated track by at least five times the wavelength of said acoustic wave.

25. A SAW filter as set forth in claim 20 wherein each said transducer has a region wherein an electrical signal is converted into an acoustical signal or vice versa, said region representing said acoustically active region of said transducer.

* * * * *

UNITED STATES PATENT AND TRADEMARK OFFICE
CERTIFICATE OF CORRECTION

PATENT NO. : 4,417,221
DATED : November 22, 1983
INVENTOR(S) : Bill J. Hunsinger It is certified that error appears in the above–identified patent and that said Letters Patent are hereby corrected as shown below:

Column 13, claim 24, please change "claim 13" to -- claim 23 --.

Signed and Sealed this

*Thirty-first* Day of *January 1984*

[SEAL]

*Attest:*

GERALD J. MOSSINGHOFF

*Attesting Officer*     *Commissioner of Patents and Trademarks*